United States Patent
Ching et al.

(10) Patent No.: US 9,006,786 B2
(45) Date of Patent: Apr. 14, 2015

(54) FIN STRUCTURE OF SEMICONDUCTOR DEVICE

(71) Applicant: Taiwan Semiconductor Manufacturing Company, Ltd., Hsin-Chu (TW)

(72) Inventors: Kuo-Cheng Ching, Zhubei (TW); Chih-Hao Wang, Baoshan Township (TW); Zhiqiang Wu, Chubei (TW); Carlos H. Diaz, Mountain View, CA (US); Jean-Pierre Colinge, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/934,992

(22) Filed: Jul. 3, 2013

(65) Prior Publication Data
US 2015/0008483 A1 Jan. 8, 2015

(51) Int. Cl.
| H01L 31/072 | (2012.01) |
| H01L 31/109 | (2006.01) |
| H01L 31/0328 | (2006.01) |
| H01L 31/0336 | (2006.01) |
| H01L 29/78 | (2006.01) |
| H01L 21/02 | (2006.01) |

(52) U.S. Cl.
CPC ...... *H01L 29/7856* (2013.01); *H01L 21/02233* (2013.01); *H01L 29/7849* (2013.01)

(58) Field of Classification Search
USPC ........... 257/190, 288, 513; 438/283, 285, 424
See application file for complete search history.

(56) References Cited

U.S. PATENT DOCUMENTS

| 6,359,311 | B1 | 3/2002 | Colinge et al. | |
| 2012/0086053 | A1* | 4/2012 | Tseng et al. | 257/288 |
| 2012/0292672 | A1* | 11/2012 | Cho | 257/288 |
| 2013/0005114 | A1* | 1/2013 | Maszara et al. | 438/425 |
| 2014/0008734 | A1* | 1/2014 | Lu | 257/401 |
| 2014/0203334 | A1* | 7/2014 | Colinge et al. | 257/288 |

OTHER PUBLICATIONS

Gas, P. et al, "Diffusion of Sb, Ga, Ge, and (As) in TiSi2," Journal of Applied Physics, vol. 63, No. 11, Jun. 1, 1998, pp. 5335-5345.
Tételin, C. et al., "Kinetics and mechanism of low temperature atomic oxygen-assisted oxidation of SiGe layers," Journal of Applied Physics, vol. 83, No. 5, Mar. 1, 1998, pp. 2842-2846.

* cited by examiner

*Primary Examiner* — Phuc Dang
(74) *Attorney, Agent, or Firm* — Slater & Matsil, L.L.P.

(57) ABSTRACT

The disclosure relates to a fin field effect transistor (FinFET). An exemplary FinFET comprises a substrate comprising a major surface; a fin structure protruding from the major surface comprising a lower portion comprising a first semiconductor material having a first lattice constant; an upper portion comprising the first semiconductor material having the first lattice constant; a middle portion between the lower portion and upper portion, wherein the middle portion comprises a second semiconductor material having a second lattice constant different from the first lattice constant; and a pair of notches extending into opposite sides of the middle portion; and an isolation structure surrounding the fin structure, wherein a top surface of the isolation structure is higher than a top surface of the pair of notches.

20 Claims, 12 Drawing Sheets

FIN STRUCTURE OF SEMICONDUCTOR DEVICE

TECHNICAL FIELD

The disclosure relates to integrated circuit fabrication, and more particularly to a semiconductor device with a fin structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, poor isolation between adjacent fins causes high leakage current of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
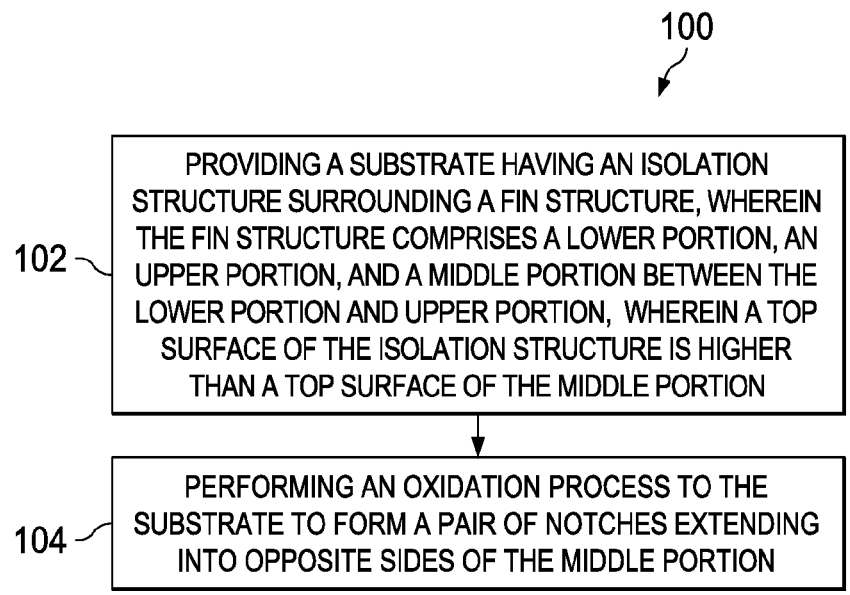
FIG. 1 is a flowchart illustrating a method of fabricating a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a semiconductor device according to various aspects of the present disclosure. The method 100 begins with step 102 in which a substrate having an isolation structure surrounding a fin structure is provided, wherein the fin structure comprises a lower portion, an upper portion, and a middle portion between the lower portion and upper portion, wherein a top surface of the isolation structure is higher than a top surface of the middle portion. The method 100 continues with step 104 in which an oxidation process is performed to the substrate to form a pair of notches extending into opposite sides of the middle portion. The discussion that follows illustrates embodiments of semiconductor devices that can be fabricated according to the method 100 of FIG. 1.

Figure 2:
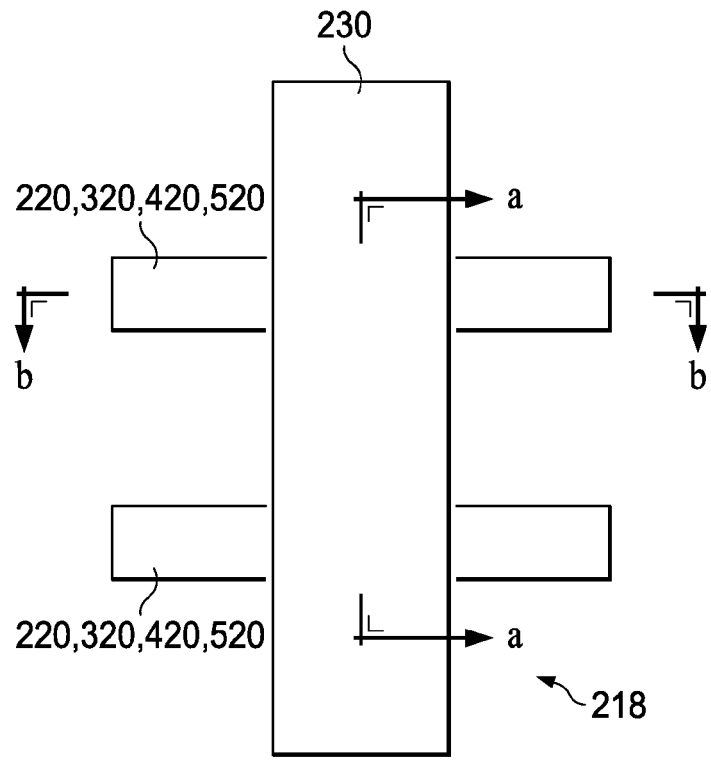
FIG. 2 shows a top view of a semiconductor device comprising a fin structure according to various aspects of the present disclosure.

FIG. 2 shows a top view of a semiconductor device 200, 300, 400, or 500 comprising a fin structure 220, 320, 420, or 520 according to various aspects of the present disclosure. FIGS. 3A-9B are cross-sectional views of a semiconductor device 200 at various stages of fabrication according to various embodiment of the present disclosure. FIGS. 10A and 10B are cross-sectional views of a semiconductor device 300 at various stages of fabrication according to various embodiment of the present disclosure. FIGS. 11A-12B are cross-sectional views of a semiconductor device 400 at various stages of fabrication according to various embodiment of the present disclosure. FIGS. 13A and 13B are cross-sectional views of a semiconductor device 500 at various stages of fabrication according to various embodiment of the present disclosure. Each figure denoted with a letter "A" shows a cross-section view of the semiconductor device 200, 300, 400, or 500 taken along line a-a of FIG. 2; and each figure denoted with a letter "B" shows a cross-section view of the semiconductor device 200, 300, 400, or 500 taken along line b-b of FIG. 2.

As employed in the present disclosure, the term semiconductor device 200, 300, 400, or 500 refers to a fin field effect transistor (FinFET) and is hereinafter referred to as FinFET 200, 300, 400, or 500. The FinFET 200, 300, 400, or 500 refers to any fin-based, multi-gate transistor. Other transistor structures and analogous structures are within the contemplated scope of the disclosure. The FinFET 200, 300, 400, or 500 may be included in a microprocessor, memory cell, and/or other integrated circuit (IC).

It is noted that the method of FIG. 1 does not produce a completed FinFET 200, 300, 400, or 500. A completed FinFET 200, 300, 400, or 500 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 13B are simplified for a better understanding of the concepts of the present disclosure. For example, although the figures illustrate the FinFET 200, 300, 400, or 500, it is understood the IC may comprise a number of other devices comprising resistors, capacitors, inductors, fuses, etc.

FIG. 2 illustrates a semiconductor device 200, 300, 400, or 500 fabricated using the steps in FIG. 1. The semiconductor device 200, 300, 400, or 500 comprises a FinFET (also referred to as a FinFET 200, 300, 400, or 500 hereafter). For illustration, the FinFET 200, 300, 400, or 500 comprises a fin structure 220, 320, 420, or 520, an isolation structure 218 surrounding the fin structure 220, 320, 420, or 520, and a gate structure 230 traversing over channel portion of the fin structure 220, 320, 420, or 520. For illustration, the FinFET 200, 300, 400, or 500 comprises two fins. In some embodiments, the FinFET 200, 300, 400, or 500 may comprise less than or greater than two fins, for example, one fin or three fins.

As depicted in FIGS. 3A-9B, and step 102 in FIG. 1, a substrate 202 having the isolation structure 218 surrounding the fin structure 220 is provided, wherein the fin structure 220 comprises a lower portion 220*l*, an upper portion 220*u*, and a middle portion 220*m* between the lower portion 220*l* and upper portion 220*u*, wherein a top surface 218*s* of the isolation structure 218 is higher than a top surface 220*s* of the middle portion 220*m* (shown in FIGS. 8A-13B).

Figure 3A:
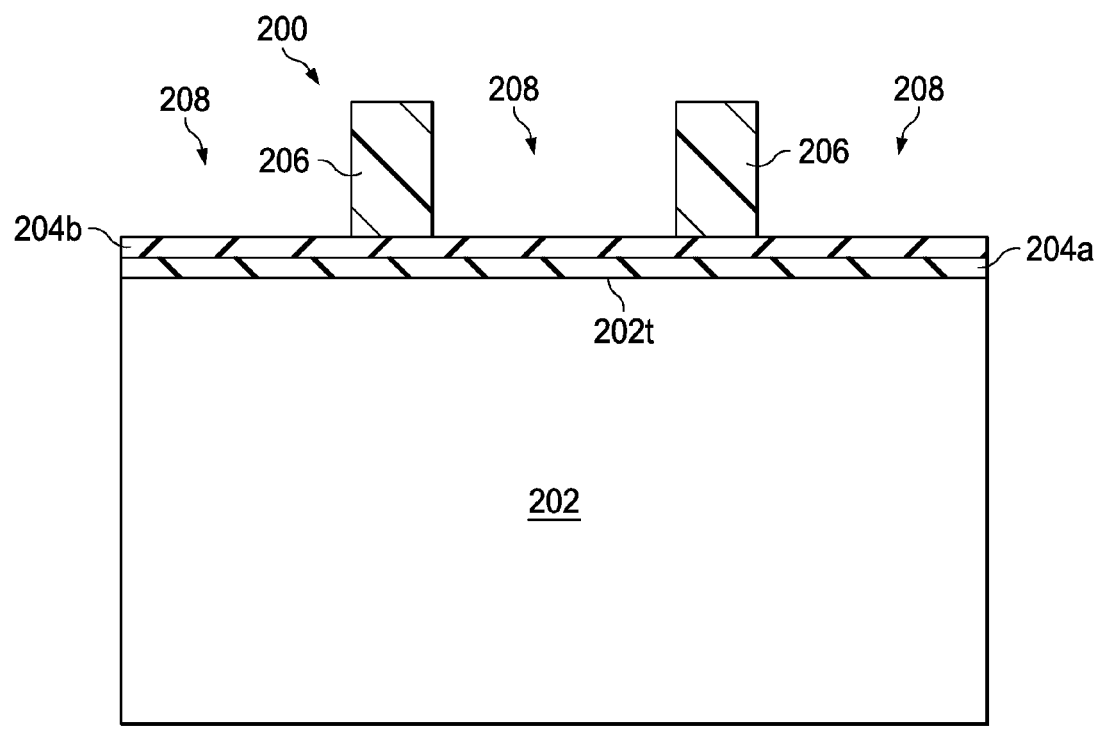
FIGS. 3A-9B are cross-sectional views of a semiconductor device at various stages of fabrication according to various embodiment of the present disclosure.
Figure 3B:
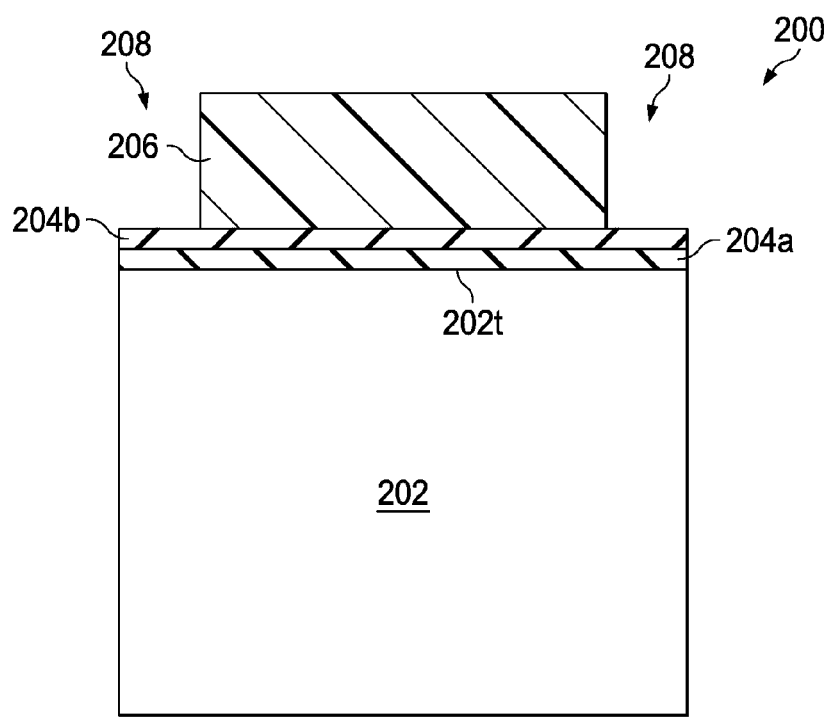

Referring to FIGS. 3A and 3B, the substrate 202 comprises a first semiconductor material having a first lattice constant and hence is also referred to as first semiconductor material 202 in the present disclosure. In some embodiments, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 202 may be made of some other suitable elemental semiconductor, such as a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204*a* and a mask layer 204*b* are formed on a top surface 202t of the semiconductor substrate 202. The pad layer 204*a* may be a thin film comprising silicon oxide formed, for example, using a thermal oxidation process. The pad layer 204*a* may act as an adhesion layer between the semiconductor substrate 202 and mask layer 204*b*. The pad layer 204*a* may also act as an etch stop layer for etching the mask layer 204*b*. In an embodiment, the mask layer 204*b* is formed of silicon nitride, for example, using low-pressure chemical vapor deposition (LPCVD) or plasma enhanced chemical vapor deposition (PECVD). The mask layer 204*b* is used as a hard mask during subsequent photolithography processes. A photo-sensitive layer 206 is formed on the mask layer 204*b* and is then patterned, forming openings 208 in the photo-sensitive layer 206.

Figure 4A:
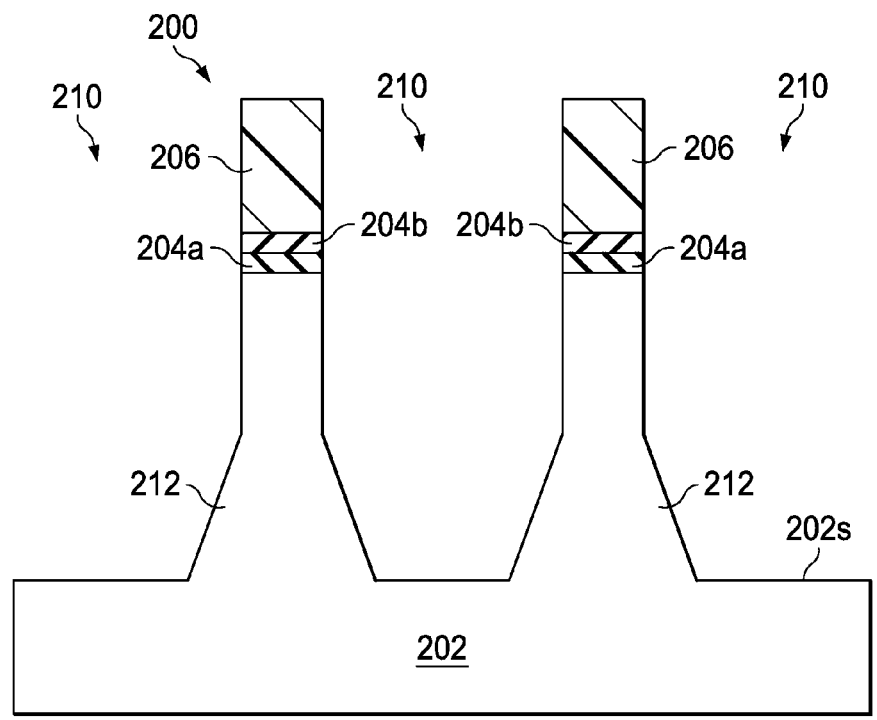
Figure 4B:
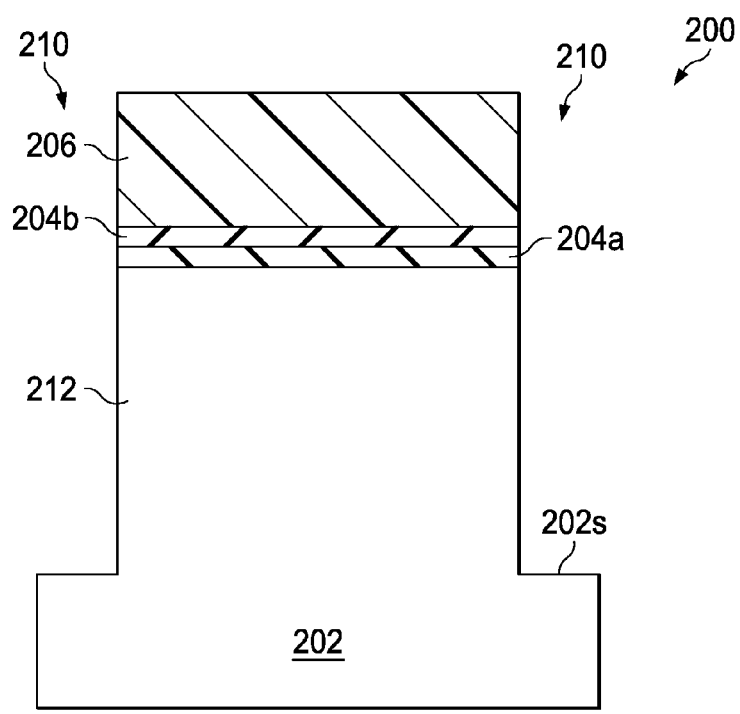

As depicted in FIGS. 4A-5B, for forming shallow trench isolation (STI) regions (such as STI regions 216 shown in FIGS. 5A and 5B) within the substrate 202, the structures in FIGS. 4A and 4B are produced by forming semiconductor fins 212 in the substrate 202. In some embodiments, the mask layer 204*b* and pad layer 204*a* are etched through openings 208 to expose underlying semiconductor substrate 202. The exposed semiconductor substrate 202 is then etched to form trenches 210 with major surfaces 202*s* of the semiconductor substrate 202. Portions of the semiconductor substrate 202 between trenches 210 form the semiconductor fins 212. In some embodiments, the trenches 210 may be strips (viewed from in the top of the FinFET 200) parallel to each other, and closely spaced with respect to each other. In some embodiments, the trenches 210 may be continuous and surrounding the semiconductor fins 212.

In the depicted embodiment, the semiconductor fins 212 protruding from the substrate major surface 202*s* comprise two fins. The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

Figure 5A:
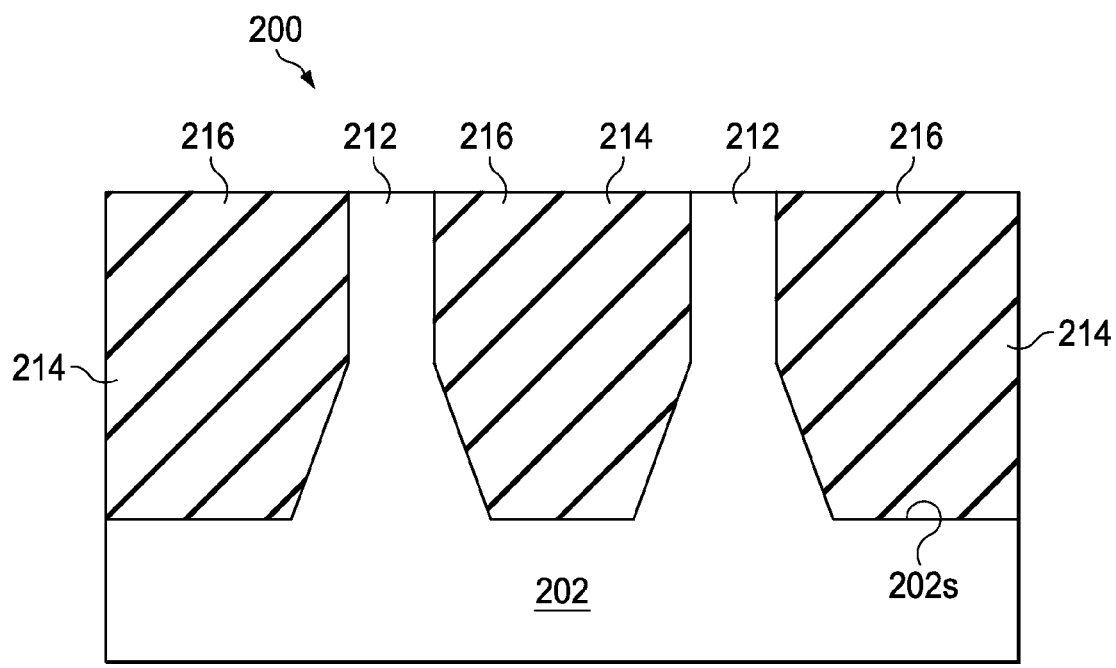
Figure 5B:
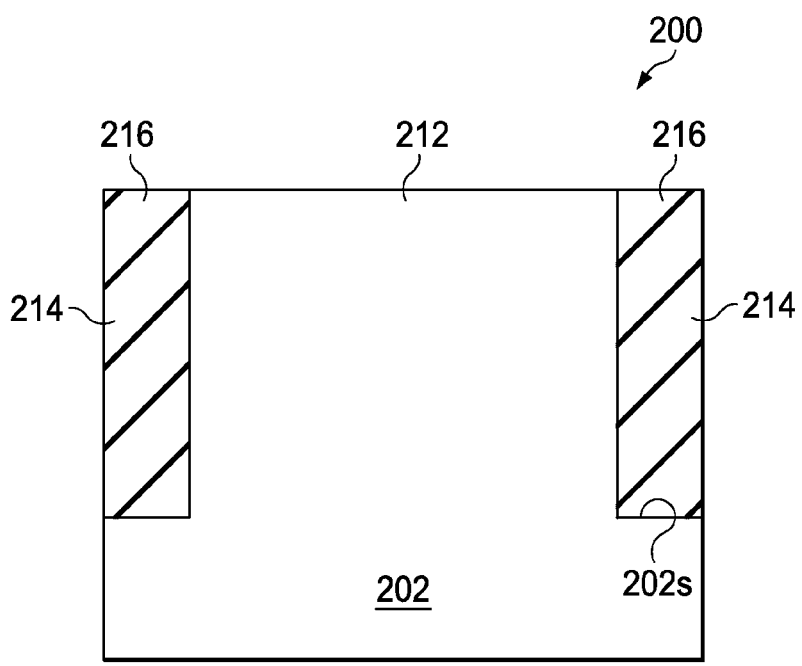

FIGS. 5A and 5B depict the resulting structures after the deposition of a dielectric material 214. In some embodiments, the trenches 210 are filled with the dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In some embodiments, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

A chemical mechanical polish is then performed to form the STI regions 216, followed by the removal of the mask layer 204*b* and pad layer 204*a*. In one embodiment, the mask layer 204*b* is formed of silicon nitride, the mask layer 204*b* may be removed using a wet process using hot $H_3PO_4$, while pad layer 204*a* may be removed using diluted HF acid, if formed of silicon oxide.

Figure 6A:
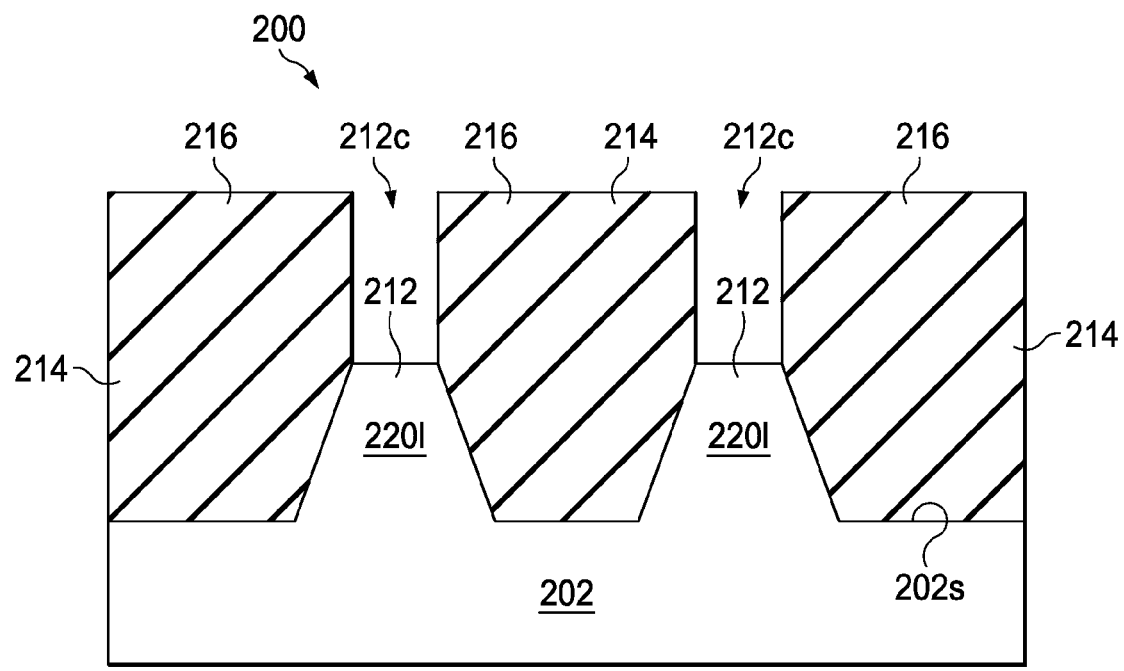
Figure 6B:
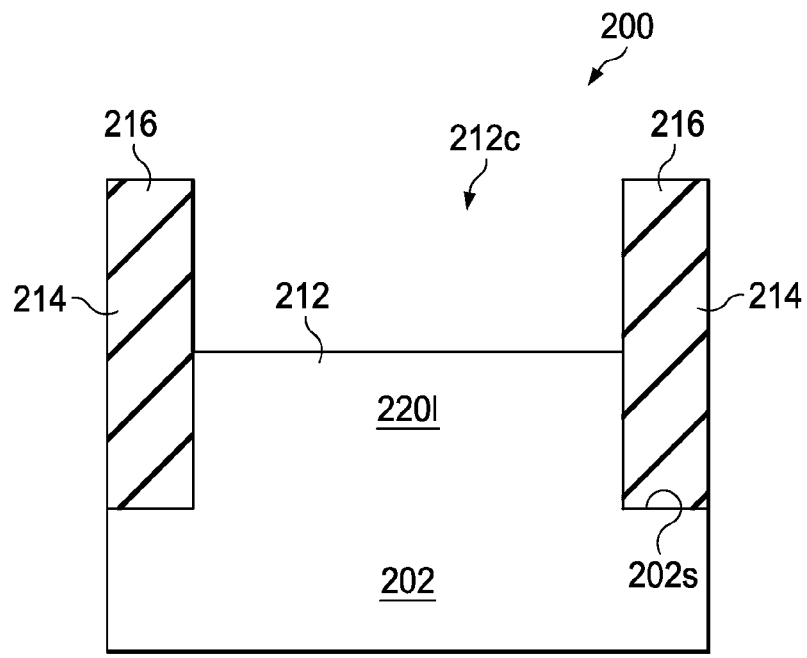

As depicted in FIGS. 6A and 6B, upper portions of the semiconductor fins 212 are replaced by other semiconductor material to enhance device performance. Using the STI regions 216 as a hard mask, an anisotropic plasma etching process is performed to recess semiconductor fins 212 that are unprotected or exposed to form the channel cavities 212*c* between the neighboring STI regions 216 (shown in FIGS. 6A and 6B). The remaining portions of the semiconductor fins 212 between the neighboring STI regions 216 are hereinafter referred to as lower portion 220*l* of the fin structure 220, protruding from the major surface 202*s* of the substrate 202. In some embodiments, the lower portion 220*l* may include the first semiconductor material 202 having the first lattice constant. In some embodiments, the first semiconductor material 202 comprises Si or III-V semiconductor material. In some embodiments, the etching process may be performed using a chemical selected from $Cl_2$, HBr, $NF_3$, $CF_4$, and $SF_6$ as an etching gas.

Figure 7A:
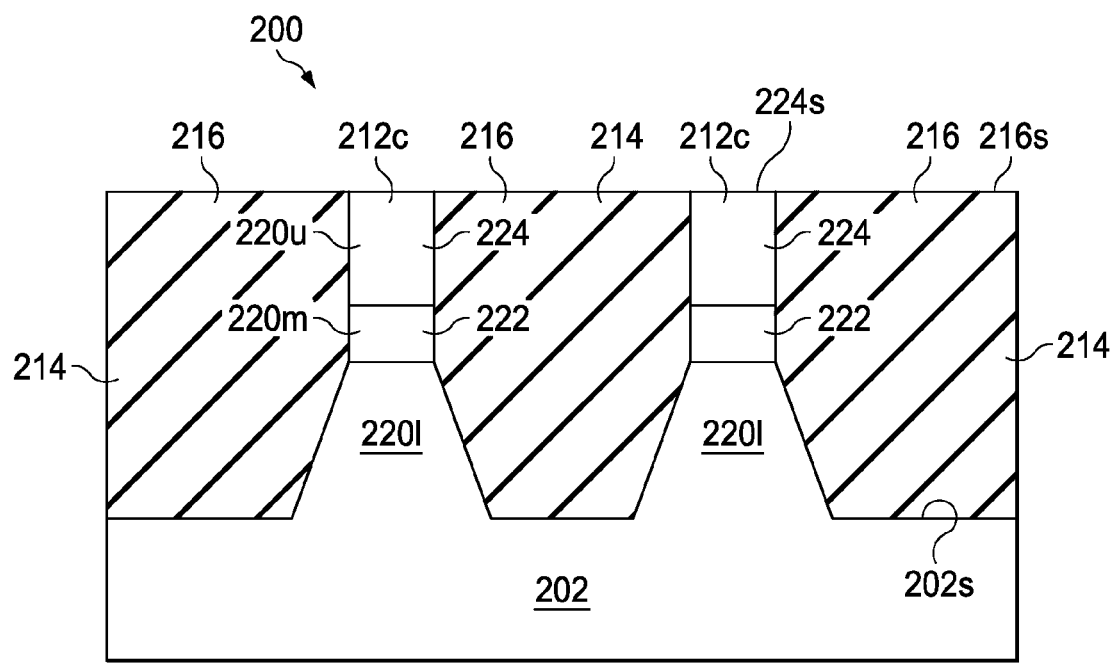
Figure 7B:
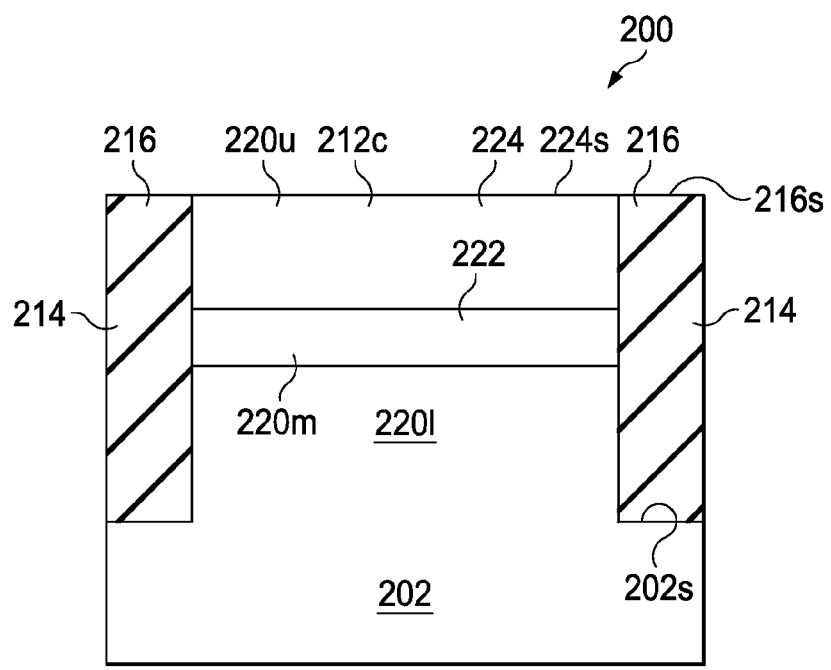

Next, the structures of FIGS. 7A and 7B are produced by selectively growing a second semiconductor material 222 partially filling in the channel cavities 212c, wherein the second semiconductor material 222 has a second lattice constant different from the first lattice constant. In some embodiments, the second semiconductor material 222 comprises Ge or SiGe. Further, the second semiconductor material 222 is hereinafter referred to as a middle portion 220m of the fin structure 220.

In some embodiments, the second semiconductor material 222 comprises Ge. In the depicted embodiment, the second semiconductor material 222 such as Ge is selectively grown by an LPCVD process to partially fill the channel cavities 212c. In one embodiment, the LPCVD process is performed at a temperature of about 350° C. to 450° C. and under a pressure of about 10 mTorr to 100 mTorr, using $GeH_4$, $GeH_3CH_3$, and/or $(GeH_3)_2CH_2$ as epitaxial gases. Optionally, an anneal process after the growing process is performed at a temperature of about 550° C. to 750° C. to confine dislocation defects on the interface of the Si and Ge epitaxial layer.

In some embodiments, the second semiconductor material 222 comprises SiGe. In the depicted embodiment, the second semiconductor material 222 such as SiGe is selectively grown by an LPCVD process to partially fill the channel cavities 212c. In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

Still referring to FIGS. 7A and 7B, subsequent to the formation of the second semiconductor material 222, the structures of FIGS. 7A and 7B are produced by selectively growing a third semiconductor material 224 filling in the channel cavities 212c, wherein the third semiconductor material 224 is substantially the same material as the first semiconductor material 202 having the first lattice constant.

In some embodiments, the third semiconductor material 224 comprises Si. In the depicted embodiment, the third semiconductor material 224 such as Si is selectively grown by an LPCVD process to fill the channel cavities 212c. In the depicted embodiment, the LPCVD process is performed at a temperature of about 400 to 800° C. and under a pressure of about 1 to 100 Torr, using $SiH_4$, and $H_2$ as reaction gases.

After the growing, a planarization such as a CMP is performed, so that a top surface 224s of the third semiconductor material 224 is substantially level with a top surface 216s of the STI regions 216. In some embodiments, the third semiconductor material 224 forms upper portions 220u of the fin structure 220. Further, the fin structure 220 comprises the lower portion 220l, upper portion 220u, and middle portion 220m between the lower portion 220l and upper portion 220u.

Figure 8A:
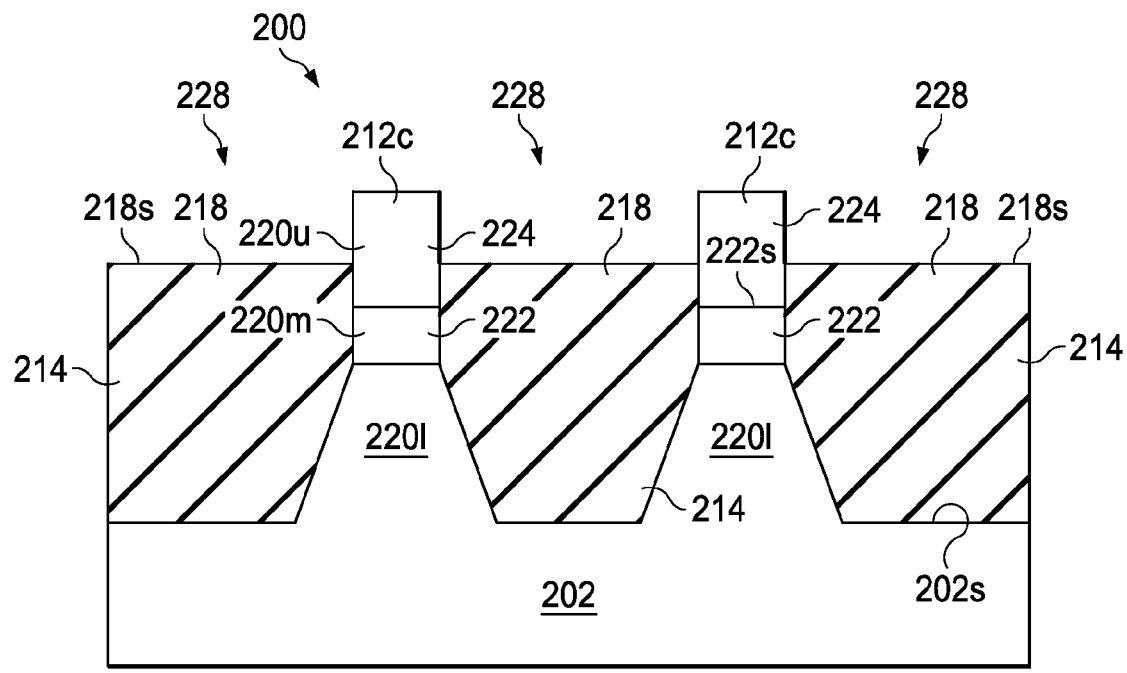
Figure 8B:
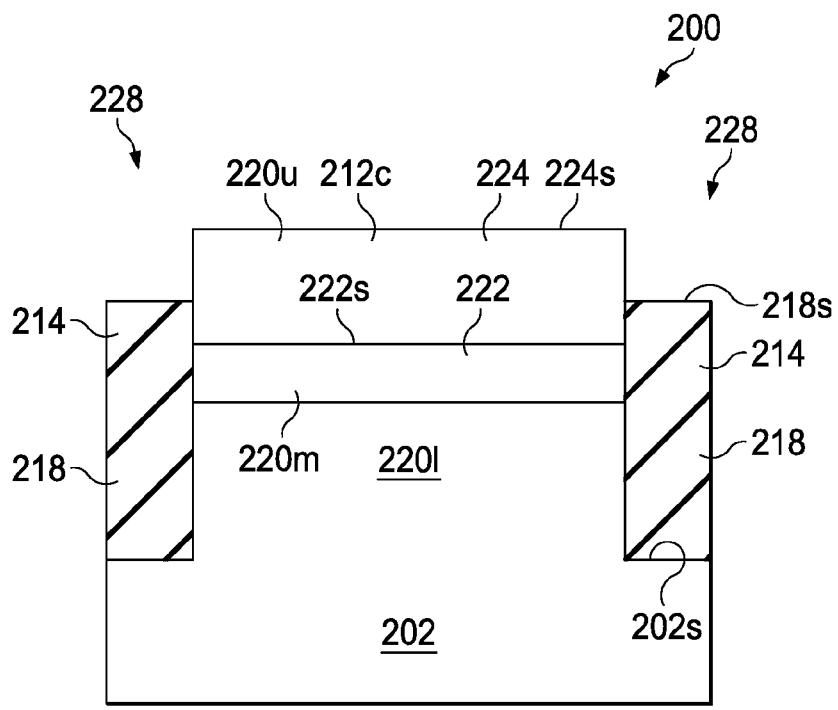

Next, the STI regions 216 are recessed by an etching step to expose a portion of the upper portion 220u, resulting in recesses 228 and a remaining oxide 214 (shown in FIGS. 8A and 8B). The remaining oxide 214 surrounding the fin structure 220 is hereinafter referred to as an isolation structure 218, wherein a top surface 218s of the isolation structure 218 is higher than a top surface 222s of the second semiconductor material 222. In some embodiments, the etching step may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases. In the depicted embodiment, the exposed portion (i.e., the portion of the upper portion 220u) comprises source/drain (S/D) portions and a channel portion between the S/D portions. The channel portion is used to form channel region of the FinFET 200.

The process steps up to this point have provided the substrate 202 having the fin structure 220 protruding from the major surface 202s. Conventionally, fins of the fin structure 220 are closely spaced with respect to each other. By introducing the isolation structure 218 surrounding the fin structure 220, each fin of the fin structure 220 is isolated from neighboring fins. However, the substrate 202 may provide a carrier transportation path between adjacent fins. Poor isolation between adjacent fins causes high leakage current of the FinFET, thereby degrading the device performance.

Accordingly, the processing discussed below with reference to FIGS. 9A and 9B may form a pair of notches in the fin structure 220 to narrower carrier transportation path between adjacent fins. Problems associated with high leakage current due to poor isolation may be reduced and/or avoided. Thus, Applicant's method may achieve the desired device performance characteristics, such as breakdown effect and leakage.

Figure 9A:
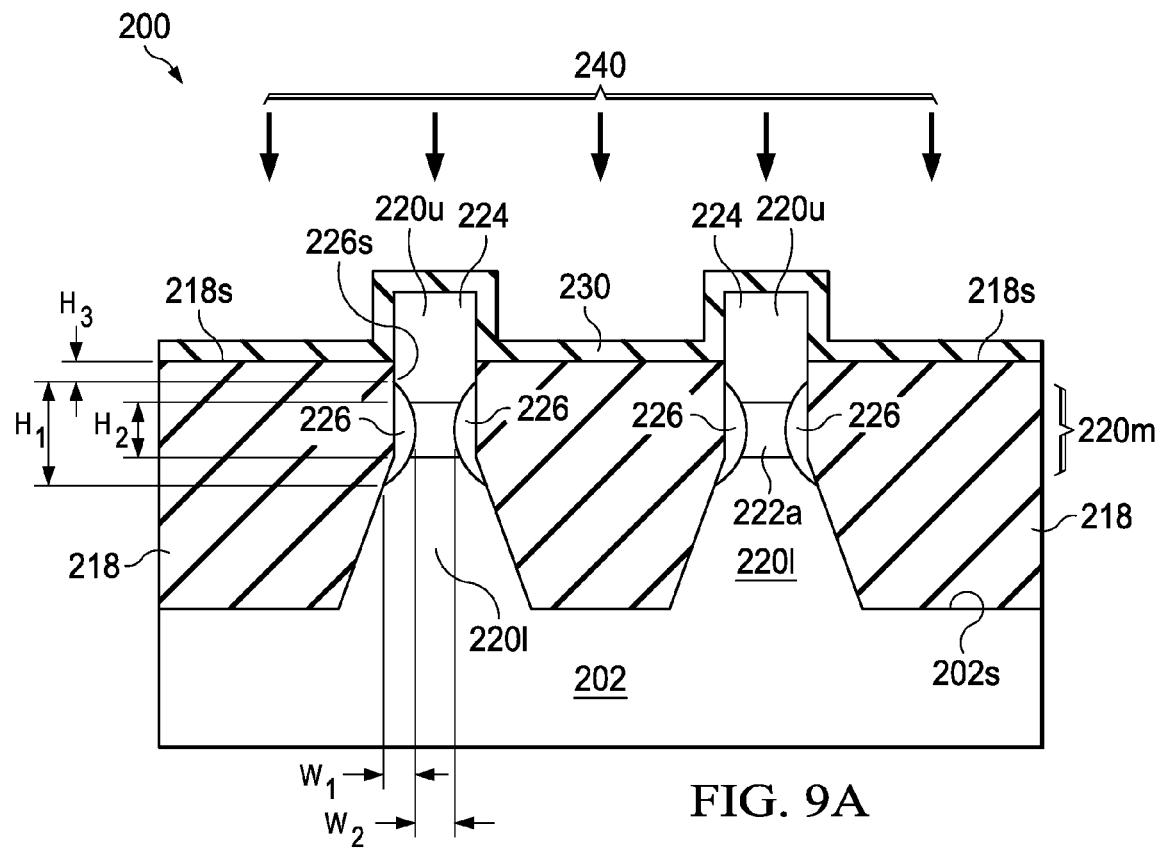
Figure 9B:
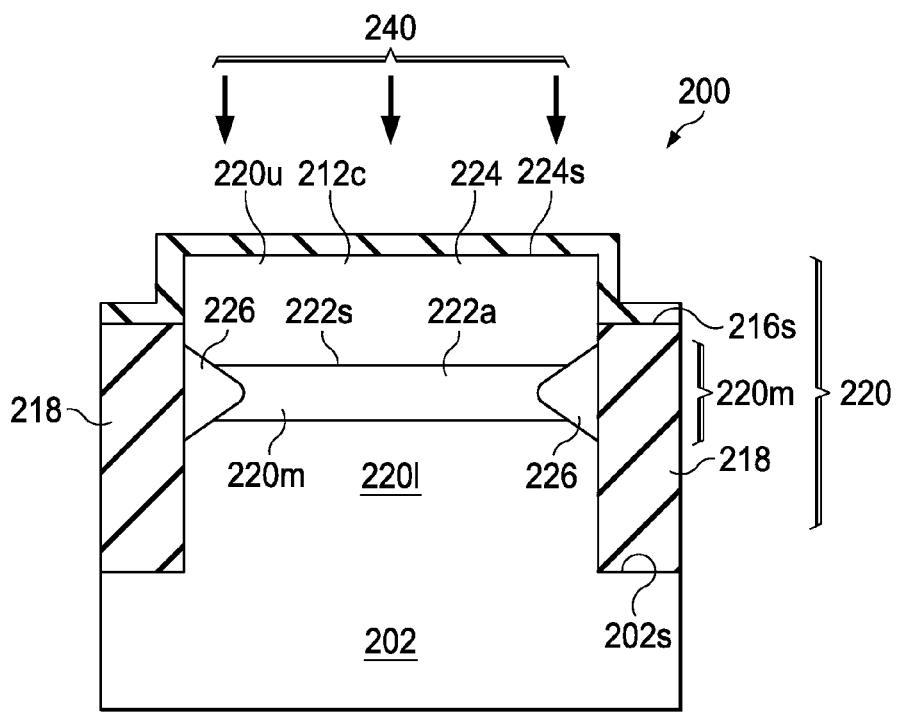
Figure 10A:
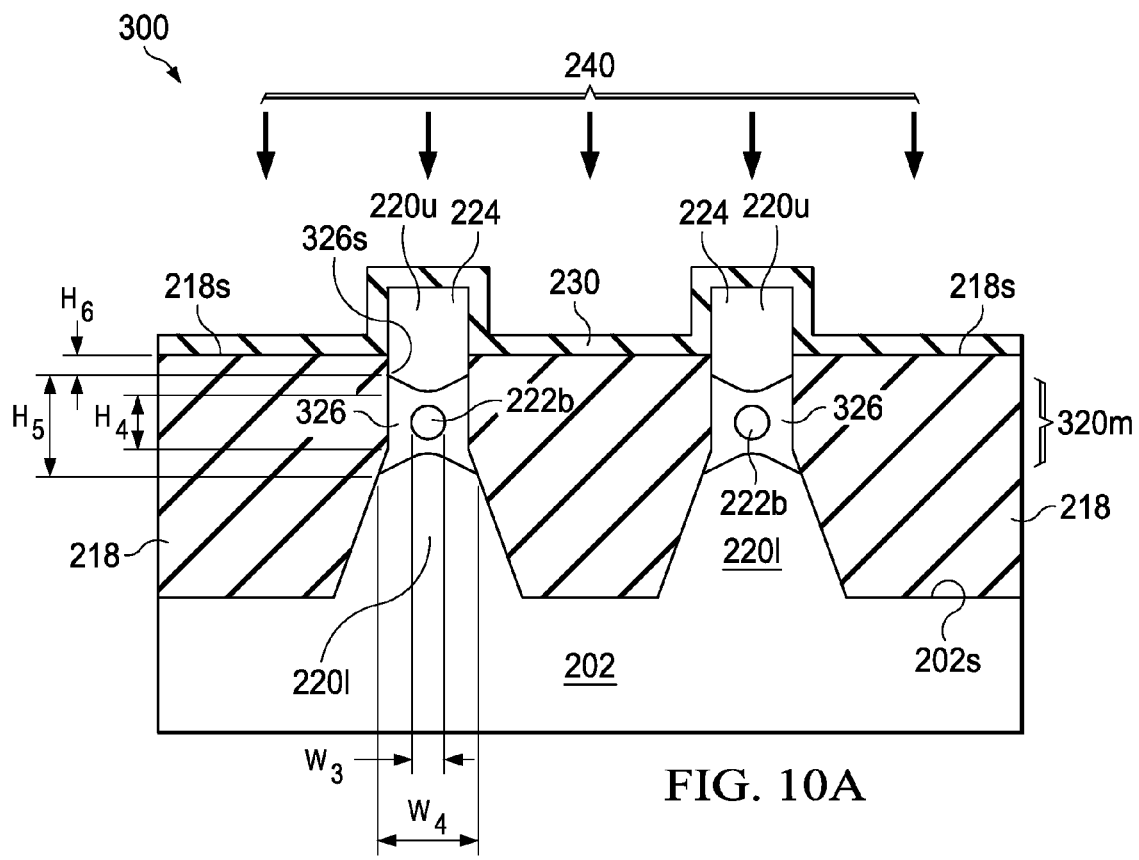
FIGS. 10A and 10B are cross-sectional views of a semiconductor device at various stages of fabrication according to various embodiment of the present disclosure.
Figure 10B:
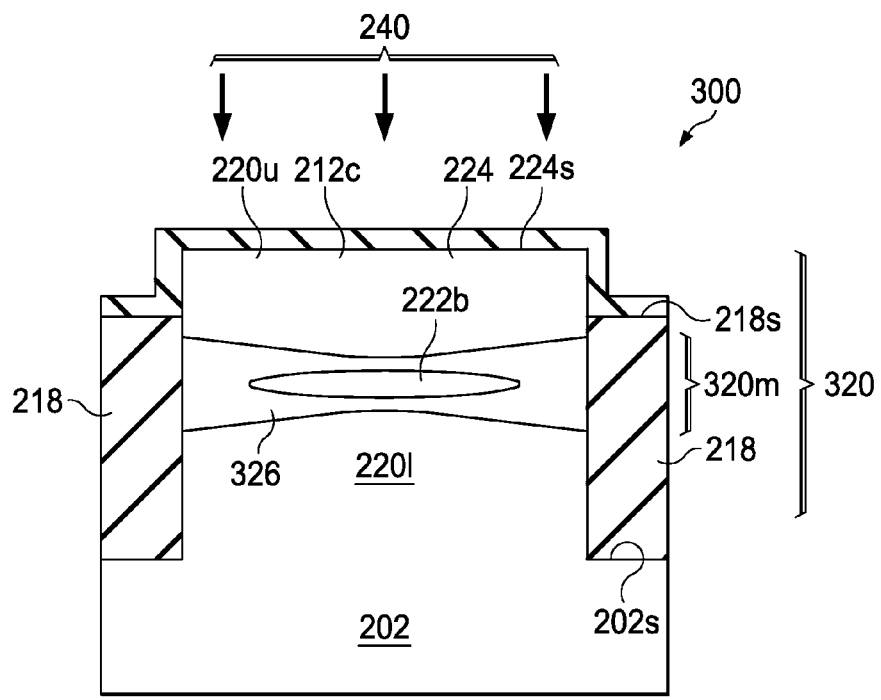

As depicted in FIGS. 9A-9B and step 104 in FIG. 1, for fabricating a pair of notches in the fin structure 220, the structure in FIGS. 9A and 9B is produced by performing an oxidation process 240 to the substrate 202 to form a pair of notches 226 extending into opposite sides of the middle portion 220m. In some embodiments, the step of performing the oxidation process 240 to the substrate 202 is before forming source/drain portions.

In some embodiments, an optionally sacrificial oxide layer 230 is first deposited over the exposed portion of the upper portion 220u and the top surface 218s of the isolation structure 218. The sacrificial oxide layer 230 may be a thin film comprising silicon oxide formed, for example, using an LPCVD or PECVD process. Then, the step of the oxidation process 240 to the substrate 202 is performed at a temperature of about 500° C. to about 600° C. and under a pressure of about 1 atm to about 20 atm, using $H_2O$ as a reaction gas.

As a result of the oxidation, rather than oxidizing outer surfaces of the upper portion 220u (with low strain or no strain), the pair of notches 226 is generated adjacent to the second semiconductor material 222 (with high strain). In some embodiments, the pair of notches 226 extends into opposite sides of the second semiconductor material 222 (i.e., in an inward direction) and further extends into an upper edge portion of the first semiconductor material 202 and a lower edge portion of the third semiconductor material 224. Further, the pair of notches 226 extends from a source/drain portion to a channel portion of the FinFET 200 (shown in FIG. 9B).

As such, a first maximum height $H_1$ of one of the pair of notches 226 is greater than a second maximum height $H_2$ of the remaining second semiconductor material 222a. In some embodiments, a ratio of the first maximum height $H_1$ to a second maximum height $H_2$ is from about 1.05 to 1.2. In some embodiments, a ratio of a first maximum width $W_1$ of one of the pair of notches 226 to a second minimum width $W_2$ of the remaining second semiconductor material 222a is from about 0.1 to about 2. In some embodiments, the top surface 218s of the isolation structure 218 is higher than a top surface 226s of the pair of notches 226. In some embodiments, a third height $H_3$ between the top surface 218s of the isolation structure 218 and the top surface 226s of the pair of notches 226 is in the range of about 1 nm to about 20 nm. In some embodiments, the pair of notches 226 comprises $GeO_x$ or $SiGeO_x$.

In the depicted embodiment, the pair of notches 226 and remaining second semiconductor material 222a are combined and also hereinafter referred to as a middle portion 220m of the fin structure 220. In some embodiments, the upper portion 220u, middle portion 220m, and lower portion 220l are combined and also hereinafter referred to as the fin structure 220.

As such, the fin structure 220 protruding from the major surface 202s comprises the lower portion 220l comprising the first semiconductor material 202 having the first lattice constant, upper portion 220u comprising the first semiconductor material 202 (i.e., the third semiconductor material 224) having the first lattice constant, and middle portion 220m between the lower portion 220l and upper portion 220u, wherein the middle portion 220m comprises the second semiconductor material 222a having a second lattice constant different from the first lattice constant, and the pair of notches 226 extending into opposite sides of the middle portion 220m. Thus, using the fin structure 220 with the pair of notches 226, Applicant's method can help narrower carrier transportation path between adjacent fins.

In some embodiments, the fin structure 220 may be further oxidized until one of the pair of notches 226 contacts another one of the pair of notches 226 to form a semiconductor oxide 326 surrounding the remaining second semiconductor material 222b (shown in FIGS. 10A and 10B). It should be noted that additional oxidation is not allowable due to decreased channel portion, resulting from reduced volume of the upper portion 220u.

As such, a ratio of a fourth maximum height $H_4$ of the remaining second semiconductor material 222b to a fifth maximum height $H_5$ of the semiconductor oxide 326 is from about 0.1 to about 0.5. In some embodiments, the top surface 218s of the isolation structure 218 is higher than a top surface 326s of the semiconductor oxide 326. In some embodiments, a sixth height $H_6$ between the top surface 218s of the isolation structure 218 and the top surface 326s of the semiconductor oxide 326 is in the range of about 1 nm to about 20 nm. In some embodiments, a ratio of a third maximum width $W_3$ of the remaining second semiconductor material 222b to a fourth maximum width $W_4$ of the semiconductor oxide 326 is from about 0.1 to about 0.3. In some embodiments, the semiconductor oxide 326 comprises $GeO_x$ or $SiGeO_x$.

In the depicted embodiment, the semiconductor oxide 326 and remaining second semiconductor material 222b are combined and also hereinafter referred to as a middle portion 320m. In some embodiments, the upper portion 220u, middle portion 320m, and lower portion 220l are combined and also hereinafter referred to as the fin structure 320.

As such, the fin structure 320 protruding from the major surface 202s comprises the lower portion 220l comprising the first semiconductor material 202 having a first lattice constant; upper portion 220u comprising the first semiconductor material (i.e. the third semiconductor material 224) having the first lattice constant; and middle portion 320 between the lower portion 220l and upper portion 220u, wherein the middle portion 320 comprises the semiconductor oxide 326 surrounding the second semiconductor material 222b, wherein the second semiconductor material 222b has a second lattice constant different from the first lattice constant. Thus, using the fin structure 320 with the semiconductor oxide 326, Applicant's method can help narrower carrier transportation path between adjacent fins.

Figure 11A:
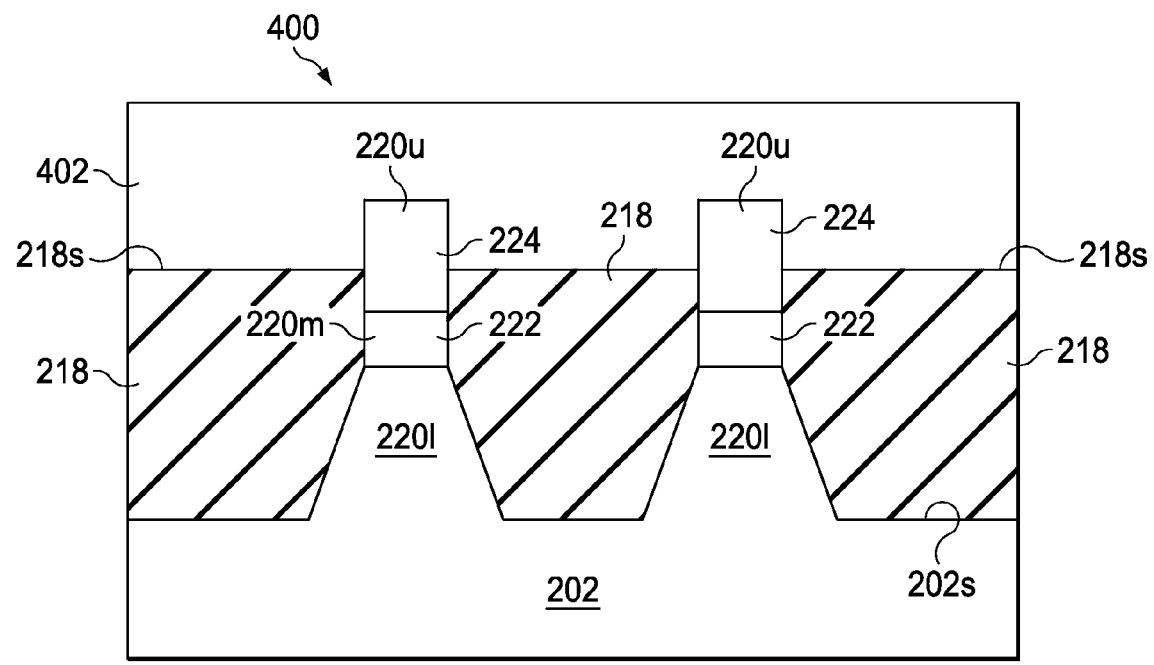
FIGS. 11A-12B are cross-sectional views of a semiconductor device at various stages of fabrication according to various embodiment of the present disclosure.
Figure 11B:
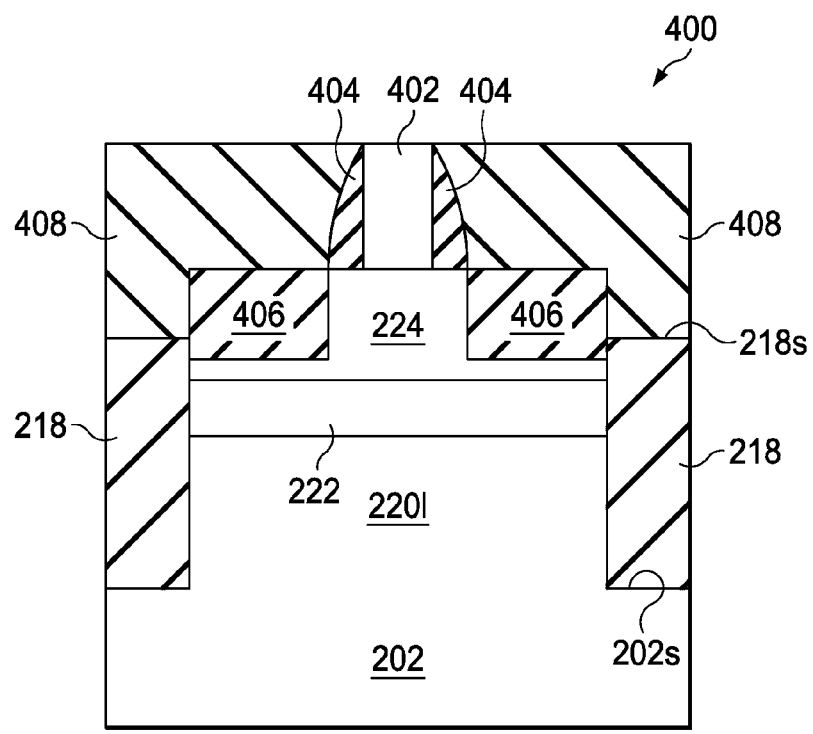

FIGS. 11A-12B are cross-sectional views of semiconductor device 400 at various stages of fabrication according to various embodiment of the present disclosure. The structures of FIGS. 11A and 11B are the structures of FIGS. 8A and 8B after subsequent fabrication processes of the embodiment comprising (1) forming a dummy gate stack 402 and a pair of spacer 404 on channel portion of the upper portion 220u, (2) replacing outer portions of the upper portion 220u with source/drain regions 406, and (3) forming an inter-layer dielectric (ILD) layer 408 surrounding the dummy gate stack 402.

Figure 12A:
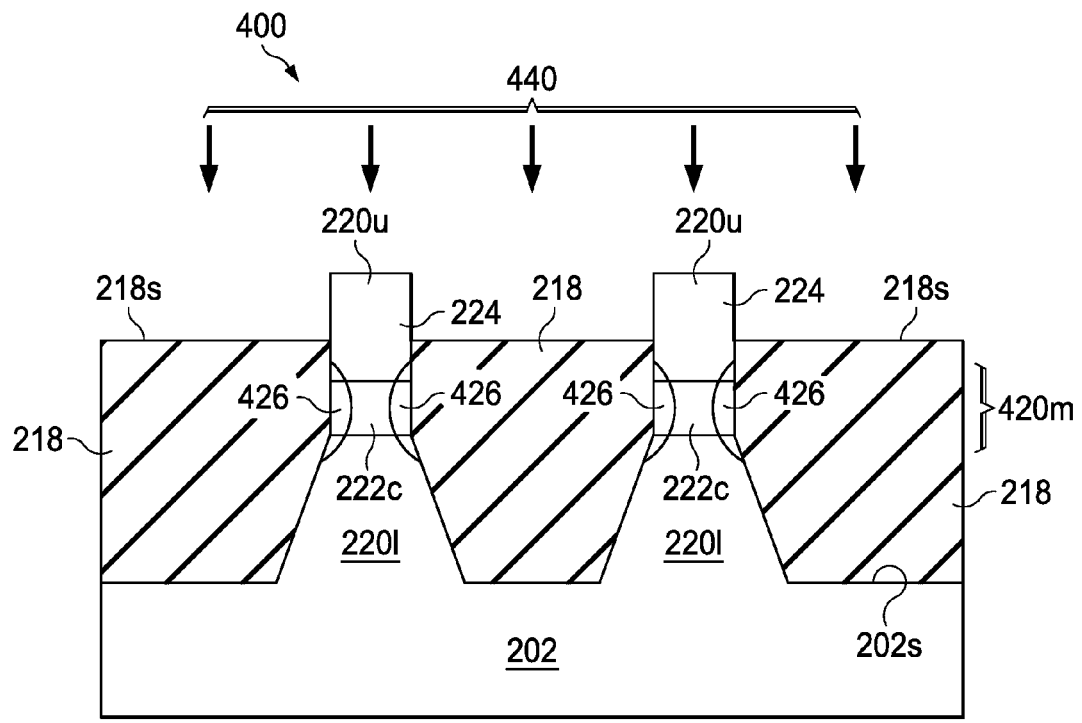
Figure 12B:
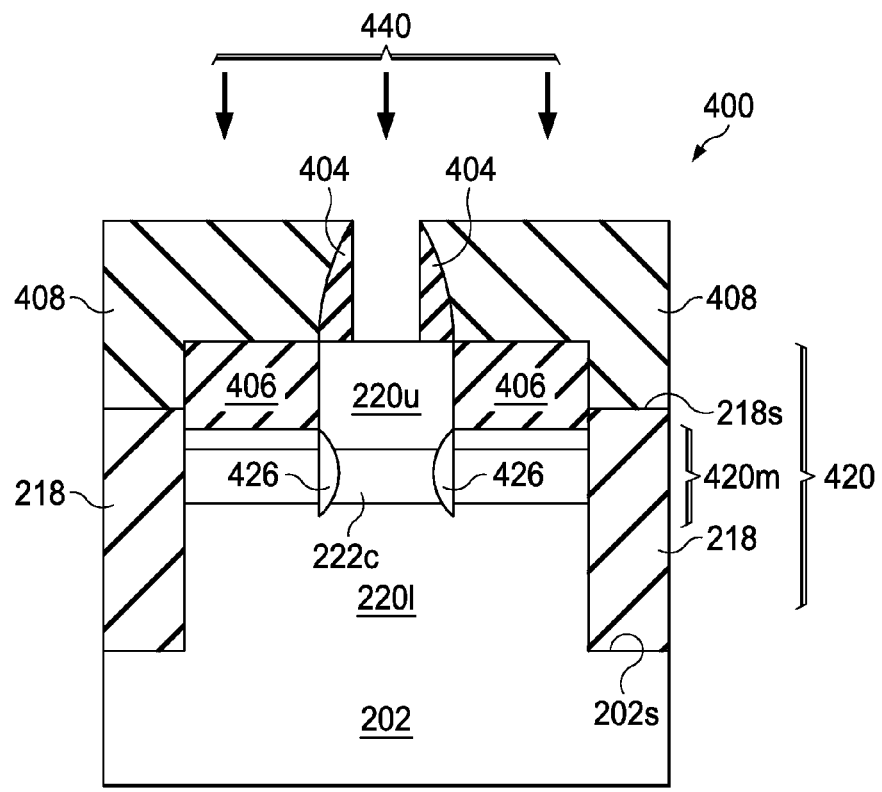
Figure 13A:
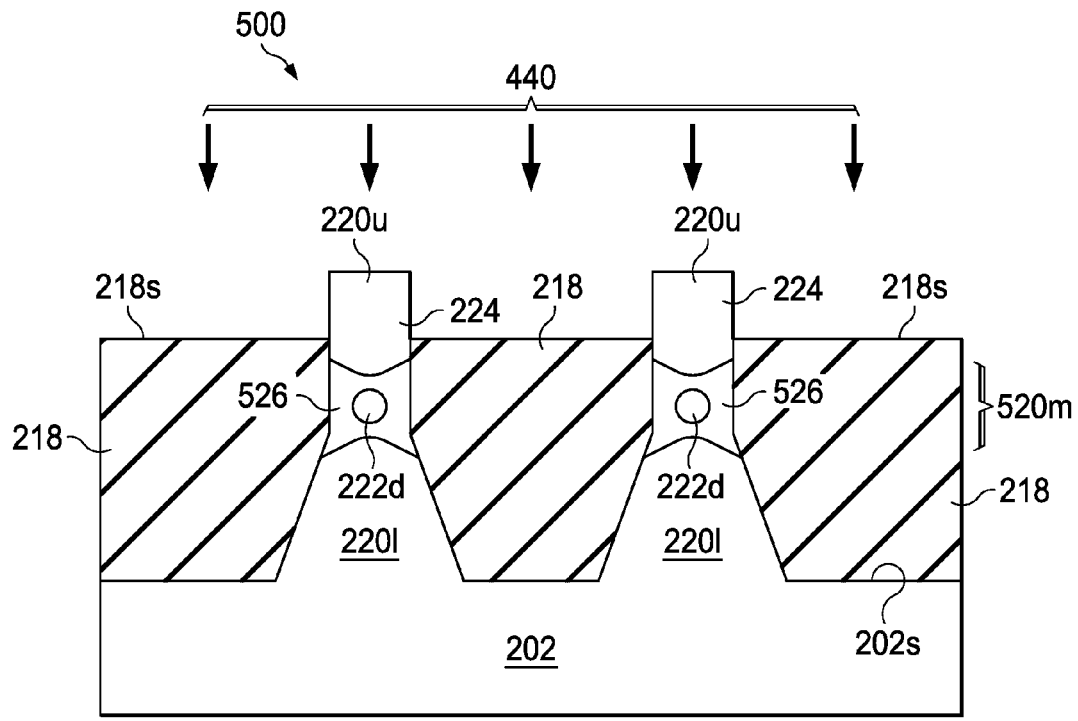
FIGS. 13A and 13B are cross-sectional views of a semiconductor device at various stages of fabrication according to various embodiment of the present disclosure.
Figure 13B:
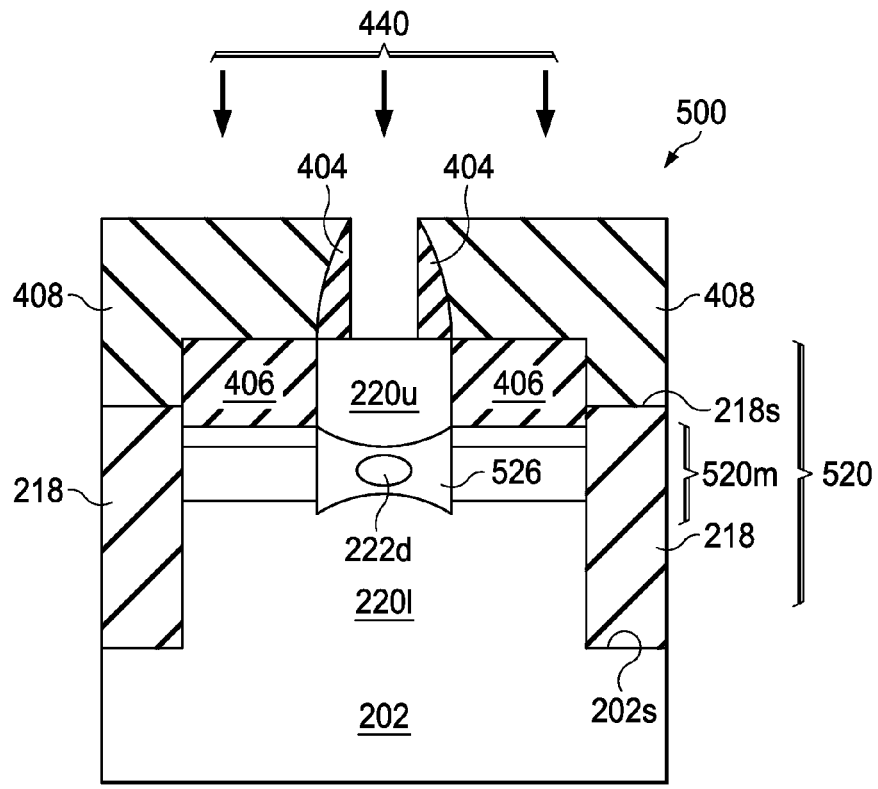

As depicted in FIGS. 12A-12B and step 104 in FIG. 1, for fabricating a pair of notches in the fin structure 420, after removing the dummy gate stack 402 to expose channel portion of the upper portion 220u, the structure in FIGS. 12A and 12B is produced by performing an oxidation process 440 to the substrate 202 to form a pair of notches 426 extending into opposite sides of the middle portion 420m. In some embodiments, the step of performing the oxidation process 440 to the substrate 202 is after forming source/drain portions.

In the depicted embodiment, the oxidation process 440 is substantially similar to the oxidation process 240 described with reference to FIGS. 9A and 9B. Namely, the step of the oxidation process 440 to the substrate 202 is performed at a temperature of about 500° C. to about 600° C. and under a pressure of about 1 atm to about 20 atm, using $H_2O$ as a reaction gas.

As a result of the oxidation, rather than oxidizing outer surfaces of channel portion of the upper portion 220u (with low strain or no strain), the pair of notches 426 is generated adjacent to the second semiconductor material 222 (with high strain). In some embodiments, the pair of notches 426 extends into opposite sides of the second semiconductor material 222 (i.e., in an inward direction) lower than channel portion of the upper portion 220u, in other words, the pair of notches 426 extends in a channel portion of the FinFET 400 (shown in FIG. 12B). The pair of notches 426 may further extend into the first semiconductor material 202 and the third semiconductor material 224.

In the depicted embodiment, the pair of notches 426 and remaining second semiconductor material 222c are combined and also hereinafter referred to as a middle portion 420m of the fin structure 420. In some embodiments, channel portion of the upper portion 220u, middle portion 420m, and lower portion 220l are combined and also hereinafter referred to as the fin structure 420.

As such, the fin structure 420 protruding from the major surface 202s comprises the lower portion 220l comprising the first semiconductor material 202 having the first lattice constant, upper portion 220u comprising the first semiconductor material 202 (i.e., the third semiconductor material 224) having the first lattice constant, and middle portion 420m between the lower portion 220l and upper portion 220u, wherein the middle portion 420m comprises the second semiconductor material 222c having a second lattice constant different from the first lattice constant, and the pair of notches 426 extending into opposite sides of the middle portion 420m. Thus, using the fin structure 420 with the pair of notches 426, Applicant's method can help narrower carrier transportation path between adjacent fins.

In some embodiments, the fin structure 420 may be further oxidized until one of the pair of notches 426 contacts another one of the pair of notches 426 to form a semiconductor oxide 526 surrounding the remaining second semiconductor material 222d (shown in FIGS. 13A and 13B). It should be noted that additional oxidation is not allowable due to decreased channel portions of the upper portion 220u.

In the depicted embodiment, the semiconductor oxide 526 and remaining second semiconductor material 222d are combined and also hereinafter referred to as a middle portion 520m. In some embodiments, channel portion of the upper portion 220u, middle portion 520m, and lower portion 220l are combined and also hereinafter referred to as the fin structure 520.

As such, the fin structure 520 protruding from the major surface 202s comprises the lower portion 220l comprising the first semiconductor material 202 having a first lattice constant; upper portion 220u comprising the first semiconductor material (i.e. the third semiconductor material 224) having the first lattice constant; and middle portion 520 between the lower portion 220l and upper portion 220u, wherein the middle portion 520 comprises the semiconductor oxide 526 surrounding the second semiconductor material 222d, wherein the second semiconductor material 222d has a second lattice constant different from the first lattice constant. Thus, using the fin structure 520 with the semiconductor oxide 526, Applicant's method can help narrower carrier transportation path between adjacent fins.

It is understood that the FinFET 200, 300, 400, or 500 may undergo further CMOS processes to form various features such as gate stack, contacts/vias, interconnect metal layers, dielectric layers, passivation layers, etc. Thus, Applicant's method can help narrower carrier transportation path between adjacent fins. Problems associated with high leakage current due to poor isolation may be avoided. Thus, Applicant's method may achieve the desired device performance characteristics, such as breakdown effect and leakage.

In accordance with embodiments, a fin field effect transistor (FinFET) comprises a substrate comprising a major surface; a fin structure protruding from the major surface comprising a lower portion comprising a first semiconductor material having a first lattice constant; an upper portion comprising the first semiconductor material having the first lattice constant; a middle portion between the lower portion and upper portion, wherein the middle portion comprises a second semiconductor material having a second lattice constant different from the first lattice constant; and a pair of notches extending into opposite sides of the middle portion; and an isolation structure surrounding the fin structure, wherein a top surface of the isolation structure is higher than a top surface of the pair of notches.

In accordance with another embodiments, a fin field effect transistor (FinFET) comprises a substrate comprising a major surface; a fin structure protruding from the major surface comprising a lower portion comprising a first semiconductor material having a first lattice constant; an upper portion comprising the first semiconductor material having the first lattice constant; and a middle portion between the lower portion and upper portion, wherein the middle portion comprises a semiconductor oxide surrounding a second semiconductor material, wherein the second semiconductor material has a second lattice constant different from the first lattice constant; and an isolation structure surrounding the fin structure, wherein a top surface of the isolation structure is higher than a top surface of the semiconductor oxide.

In accordance with another embodiments, a method of fabricating a semiconductor device comprises providing a substrate having an isolation structure surrounding a fin structure, wherein the fin structure comprises a lower portion, an upper portion, and a middle portion between the lower portion and upper portion, wherein a top surface of the isolation structure is higher than a top surface of the middle portion; and performing an oxidation process to the substrate to form a pair of notches extending into opposite sides of the middle portion.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fin field effect transistor (FinFET) comprising:
    a substrate comprising a major surface;
    a fin structure comprising:
        a lower portion protruding from the major surface of the substrate, the lower portion comprising a first semiconductor material having a first lattice constant;
        an upper portion comprising the first semiconductor material having the first lattice constant;
        a middle portion between the lower portion and upper portion, wherein the middle portion comprises a second semiconductor material having a second lattice constant different from the first lattice constant; and
        a pair of notches extending into opposite sides of the second semiconductor material of the fin structure; and
    an isolation structure surrounding the fin structure, wherein a top surface of the isolation structure is higher than a top surface of the pair of notches.

2. The FinFET of claim 1, wherein the pair of notches extends in a channel portion of the FinFET.

3. The FinFET of claim 1, wherein the pair of notches extends from a source/drain portion to a channel portion of the FinFET.

4. The FinFET of claim 1, wherein a height between the top surface of the isolation structure and the top surface of the pair of notches is in the range of about 1 nm to about 20 nm.

5. The FinFET of claim 1, wherein a ratio of a maximum width of one of the pair of notches to a minimum with of the second semiconductor material is from about 0.1 to about 2.

6. The FinFET of claim 1, wherein a first maximum height of one of the pair of notches is greater than a second maximum height of the second semiconductor material.

7. The FinFET of claim 6, wherein a ratio of the first maximum height to a second maximum height is from about 1.05 to 1.2.

8. The FinFET of claim 1, wherein the pair of notches comprises $GeO_x$ or $SiGeO_x$.

9. The FinFET of claim 1, wherein the second semiconductor material comprises Ge or SiGe.

10. A fin field effect transistor (FinFET) comprising:
    a substrate comprising a major surface;
    a fin structure comprising:
        a lower portion protruding from the major surface of the substrate, the lower portion comprising a first semiconductor material having a first lattice constant;
        an upper portion comprising the first semiconductor material having the first lattice constant; and
        a middle portion between the lower portion and upper portion, wherein the middle portion comprises a semiconductor oxide and a second semiconductor material, the semiconductor oxide extending from sidewalls of the fin structure into the fin structure and surrounding the second semiconductor material, wherein the second semiconductor material has a second lattice constant different from the first lattice constant; and
    an isolation structure surrounding the fin structure, wherein a top surface of the isolation structure is higher than a top surface of the semiconductor oxide.

11. The FinFET of claim 10, wherein the semiconductor oxide extends in a channel portion of the FinFET.

12. The FinFET of claim 11, wherein the semiconductor oxide extends from a source/drain portion to a channel portion to of the FinFET.

13. The FinFET of claim 10, wherein a height between the top surface of the isolation structure and the top surface of the semiconductor oxide is in the range of about 1 nm to about 20 nm.

14. The FinFET of claim 10, wherein a ratio of a maximum width of the second semiconductor material to a maximum width of the semiconductor oxide is from about 0.1 to about 0.3.

15. The FinFET of claim 10, wherein a ratio of a maximum height of the second semiconductor material to a maximum height of the semiconductor oxide is from about 0.1 to about 0.5.

16. The FinFET of claim 10, wherein the semiconductor oxide comprises $Geo_x$ or $SiGeO_x$.

17. The FinFET of claim 10, wherein the second semiconductor material comprises Ge or SiGe.

18. A fin field effect transistor (FinFET) comprising:
   an isolation structure disposed over a substrate; and
   a fin protruding from a major surface of the substrate, the isolation structure surrounding the fin structure, wherein the fin comprises:
      a first semiconductor material proximal the substrate, the first semiconductor material having a first lattice constant;
      a second semiconductor material disposed on a side of the first semiconductor material facing away from the substrate, the second semiconductor material having a second lattice constant different from the first lattice constant;
      a third semiconductor material disposed on a side of the second semiconductor material facing away from the substrate, the third semiconductor material having the first lattice constant; and
      a plurality of notches extending from sidewalls of the fin into the fin and surrounding the second semiconductor material, the plurality of notches further surrounding an interface between the first semiconductor material and the second semiconductor material and an interface between the second semiconductor material and the third semiconductor material.

19. The FinFET of claim 18, wherein the plurality of notches comprises an oxide of the second semiconductor material.

20. The FinFET of claim 18, wherein the second semiconductor material comprises Ge or SiGe.

* * * * *